United States Patent
Yamaguchi et al.

(10) Patent No.: US 10,792,782 B2
(45) Date of Patent: Oct. 6, 2020

(54) POLISHING-AMOUNT SIMULATION METHOD FOR BUFFING, AND BUFFING APPARATUS

(71) Applicant: EBARA CORPORATION, Tokyo (JP)

(72) Inventors: Kuniaki Yamaguchi, Tokyo (JP); Itsuki Kobata, Tokyo (JP); Toshio Mizuno, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 472 days.

(21) Appl. No.: 15/514,785

(22) PCT Filed: Jan. 18, 2016

(86) PCT No.: PCT/JP2016/051206
§ 371 (c)(1),
(2) Date: Mar. 27, 2017

(87) PCT Pub. No.: WO2016/117485
PCT Pub. Date: Jul. 28, 2016

(65) Prior Publication Data
US 2017/0216991 A1   Aug. 3, 2017

(30) Foreign Application Priority Data

Jan. 19, 2015   (JP) ................................ 2015-007699

(51) Int. Cl.
*B24B 37/005*   (2012.01)
*B24B 37/10*   (2012.01)
(Continued)

(52) U.S. Cl.
CPC ............ *B24B 37/005* (2013.01); *B24B 37/10* (2013.01); *B24B 37/34* (2013.01); *B24B 49/16* (2013.01);
(Continued)

(58) Field of Classification Search
CPC ........ B24B 37/005; B24B 37/10; B24B 37/34; B24B 49/16; H01L 21/30625; H01L 22/20
See application file for complete search history.

(56) References Cited

U.S. PATENT DOCUMENTS

| | | | |
|---|---|---|---|
| 5,599,423 A | * | 2/1997 | Parker .................. B24B 37/042 156/345.13 |
| 7,686,673 B2 | | 3/2010 | Senga et al. |

(Continued)

FOREIGN PATENT DOCUMENTS

| | | |
|---|---|---|
| JP | 2001-244222 A | 9/2001 |
| JP | 2001-269861 A | 10/2001 |

(Continued)

OTHER PUBLICATIONS

International Patent Application No. PCT/JP2016/051206; Int'l Search Report; dated Feb. 9, 2016; 2 pages.

*Primary Examiner* — Joseph J Hail
*Assistant Examiner* — J Stephen Taylor
(74) *Attorney, Agent, or Firm* — BakerHostetler

(57) ABSTRACT

The invention simulates polishing amount taking into account pressure concentration that occurs in the vicinity of the edge of a substrate when a small-diameter buffing pad overhangs the substrate to be buffed.

One embodiment of the invention provides a method for simulating polishing amount in a case where a polishing pad of a smaller size than a substrate is used to buff the substrate. The method includes measuring distributions of pressure that is applied from the polishing pad to the substrate according to each overhang amount of the polishing pad relative to the substrate by using a pressure sensor, and correcting the pressure that is used in the polishing amount (Continued)

simulation in accordance with the overhang amounts and the measured pressure distributions.

5 Claims, 14 Drawing Sheets

(51) Int. Cl.
    *B24B 49/16*     (2006.01)
    *B24B 37/34*     (2012.01)
    *H01L 21/306*     (2006.01)
    *H01L 21/66*     (2006.01)

(52) U.S. Cl.
    CPC ........ *H01L 21/30625* (2013.01); *H01L 22/20* (2013.01)

(56) References Cited

U.S. PATENT DOCUMENTS

2002/0013122 A1     1/2002   Sugaya et al.
2010/0081361 A1     4/2010   Fukuda et al.

FOREIGN PATENT DOCUMENTS

| JP | 2006-231443 A | | 9/2006 |
|---|---|---|---|
| JP | 2006-346821 A | | 12/2006 |
| JP | 2006346821 A | * | 12/2006 |
| JP | 2010-076049 A | | 4/2010 |
| JP | 2011-083856 A | | 4/2011 |

\* cited by examiner

WAFER W RADIAL DIRECTION

POLISHING-AMOUNT SIMULATION METHOD FOR BUFFING, AND BUFFING APPARATUS

CROSS-REFERENCE TO RELATED APPLICATIONS

The present disclosure is a 371 U.S. National Stage Application of Patent Application No. PCT/JP2016/051206 filed on Jan. 18, 2016, which claims priority to Japanese Patent Application No. 2015-007699 filed on Jan. 19, 2015. The entire contents of which are hereby incorporated by reference.

TECHNICAL FIELD

The present invention relates to a polishing-amount simulation method for buffing, and more specifically, to a method for calculating a pressure correction value for the polishing-amount simulation for buffing.

BACKGROUND ART

Semiconductor devices become more and more highly integrated in late years, and circuit wiring and integrated devices are accordingly miniaturized. This trend has generated a need for planarization of semiconductor wafer surfaces by polishing the surfaces coated with, for example, metal films. Planarization methods include polishing by a chemical mechanical polishing (CMP) apparatus. The chemical mechanical polishing apparatus has polishing members (polishing cloth, a polishing pad, etc.) and holding member (a top ring, a polishing head, a chuck, etc.) for holding a substrate such as a semiconductor wafer. The apparatus presses the surface (surface to be polished) of the substrate against the surface of the polishing member, and brings the polishing member and the substrate into relative movement while supplying a polishing liquid (abrasive solution, chemical solution, slurry, deionized water or the like) into between the polishing member and the substrate. In this manner, the apparatus polishes and planarizes the surface of the substrate. It is known that the chemical mechanical polishing apparatus achieves excellent polishing performance as a result of the combination of chemical and mechanical polishing actions.

In common chemical mechanical polishing, the to-be-polished surface of a substrate held by a top ring is pressed against a polishing surface having a larger diameter than the substrate. A polishing table and the top ring are then rotated while slurry as a polishing solution is supplied onto the polishing surface. The polishing surface and the to-be-polished surface thus come into relative sliding movement, which polishes the to-be-polished surface of the substrate.

In late years, the planarizing technology including CMP deals with a wide variety of materials to be polished and is required to satisfy growing demands for high polishing performance (for example, planarity, less polishing damage, and also productivity). Besides, the miniaturization of semiconductor devices creates demands for higher polishing performance and purity. In such a situation, buffing is occasionally performed in the CMP apparatus to buff a substrate by means of a buffing pad of a smaller size than the substrate to be processed. In general, a buffing pad of a smaller size than a substrate to be processed is excellent in controllability in that such a pad makes it possible to planarize the unevenness that is locally generated in the substrate, polish only a particular area of the substrate, and adjust the polishing amount according to the position of the substrate.

To enhance process efficiency and accuracy of planarity in the CMP process, it is important to accurately estimate polishing amount and efficiently optimize polishing conditions (such as control parameters of the polishing apparatus) based on the estimation. Under the situation, several simulation methods related to CMP have been proposed.

With regard to simulation for the polishing, the estimation of polishing amount is fundamental. In the conventional polishing-related simulations of various kinds, the polishing amount is estimated by Preston's formula h∝pvt, where h represents polishing rate or polishing amount for polishing a substrate (to-be-polished object); p represents load or pressure applied to the substrate; v represents contact relative velocity between a polishing member and the substrate or contact relative velocity at an area, the polishing amount in which is calculated; and t represents polishing time. In other words, the polishing amount is proportional to the product of the pressure p, the contact relative velocity v, and the polishing time t. In this specification, the term "polishing amount" also means polishing amount at each position of the substrate and is referred to also as a polishing profile.

SUMMARY OF INVENTION

Technical Problem

In the buffing is carried out using a buffing pad with a smaller diameter than a substrate, such as a semiconductor wafer, when the entire surface of the buffing pad is within a periphery of the substrate, the pressure applied from the buffing pad to the substrate is substantially even. As is known, however, when the buffing pad overhangs the substrate, that is, when the buffing pad partially protrudes over the substrate, pressure concentration occurs in the vicinity of an edge of the substrate. For this reason, the simulation of polishing amount based on Preston's formula requires consideration of effects of the pressure concentration that occurs in the vicinity of the substrate edge when the buffing pad overhangs the substrate.

In this light, an object of the present invention is to simulate polishing amount, taking into account pressure concentration that occurs in vicinity of a substrate edge when a small-diameter buffing pad overhangs the substrate to be buffed. Another object of the invention is to determine optimal buffing conditions based on the polishing amount simulation.

Solution to Problem

A first embodiment provides a method for simulating polishing amount in a case where a polishing pad of a smaller size than a substrate is used to buff the substrate. The method includes the steps of measuring distributions of pressure that is applied from the polishing pad to the substrate according to each overhang amount of the polishing pad relative to the substrate by using a pressure sensor, and correcting the pressure that is used in the polishing amount simulation in accordance with the overhang amount and the measured pressure distributions.

A second embodiment provides the method according to the first embodiment, the method including quantifying the measured distributions of the pressure applied to the substrate with respect to each overhang amount of the polishing pad relative to the substrate; one-dimensionalizing the quantified pressure distributions with respect to the each overhang amount along a radial direction of the substrate; summing the one-dimensionalized pressure distributions of the each overhang amount in the radial direction of the substrate; and determining a pressure correction value by dividing the total of the pressure distributions of the polishing pad in the each radial position of the substrate by distance of the polishing pad on the substrate.

A third embodiment provides a method for simulating polishing amount in a case where a polishing pad of a smaller size than a substrate is used to buff the substrate. The method simulates polishing amount in a case where a part of the polishing pad oscillates over the substrate during buffing.

A fourth embodiment provides the method according to the third embodiment, wherein the polishing amount is calculated using a pressure correction value for correcting an effect of pressure concentration that occurs when the polishing pad oscillates over the substrate.

A fifth embodiment provides the method according to the third or fourth embodiment, wherein a buffing condition that is required to achieve a given target polishing amount is calculated.

A sixth embodiment provides the method according to the fifth embodiment, wherein the buffing condition to be calculated is oscillation velocity of the polishing pad.

A seventh embodiment provides a computer program including a command for carrying out the simulation according to any one of the third to sixth embodiments.

An eighth embodiment provides a storage medium that stores the computer program of the seventh embodiment.

A ninth embodiment provides a buffing apparatus for buffing a substrate by using a polishing pad of a smaller size than the substrate, wherein the buffing apparatus is configured so that a part of the polishing pad oscillates over the substrate during buffing, and the buffing apparatus includes a simulation section configured to simulate polishing amount of the substrate on a given buffing condition.

A tenth embodiment provides the buffing apparatus according to the ninth embodiment, wherein the simulation section performs pressure correction for correcting an effect of pressure concentration that occurs when the polishing pad oscillates over the substrate.

An eleventh embodiment provides the buffing apparatus according to the ninth or tenth embodiment, wherein the simulation section calculates a buffing condition that is required to achieve a given target polishing amount.

A twelfth embodiment provides the buffing apparatus according to the eleventh embodiment, wherein the buffing condition to be calculated is oscillation velocity of the polishing pad.

A thirteenth embodiment provides the buffing apparatus according to the eleventh or twelfth embodiment, the buffing apparatus including a sensor for measuring the polishing amount of the substrate, wherein the simulation section compares the measured polishing amount of the substrate that is buffed on the calculated buffing condition with the target polishing amount and, if the target polishing amount is not achieved, calculates a required buffing condition based on the measured polishing amount and the target polishing amount.

A fourteenth embodiment provides a method for determining a correction value of pressure that is applied from a polishing pad to a substrate, the correction value being used to simulate polishing amount in a case where the polishing pad of a smaller size than the substrate is used to buff the substrate, wherein the method includes the steps of: measuring distributions of pressure that is applied from the polishing pad to the substrate according to each overhang amount of the polishing pad relative to the substrate by using a pressure sensor; and determining the pressure correction value based on the overhang amount and the measured pressure distribution.

A fifteenth embodiment provides the method according to the fourteenth embodiment, the method including the steps of: quantifying the measured distributions of the pressure applied to the substrate with respect to each overhang amount of the polishing pad relative to the substrate; one-dimensionalizing the quantified pressure distributions with respect to the each overhang amount along a radial direction of the substrate; summing the one-dimensionalized pressure distributions of the each overhang amount in the radial direction of the substrate; and determining a pressure correction value by dividing the total of the pressure distributions of the polishing pad in the each radial position of the substrate by distance of the polishing pad on the substrate.

DESCRIPTION OF EMBODIMENTS

Embodiments of a method for simulating polishing amount according to the present invention will be explained below with reference to the attached drawings. In the attached drawings, identical or similar components are provided with identical or similar reference marks, and overlapping descriptions will be omitted in the detailed description. Features described in each embodiment can be applied to another embodiment as long as there is no contradiction therebetween.

Figure 1:
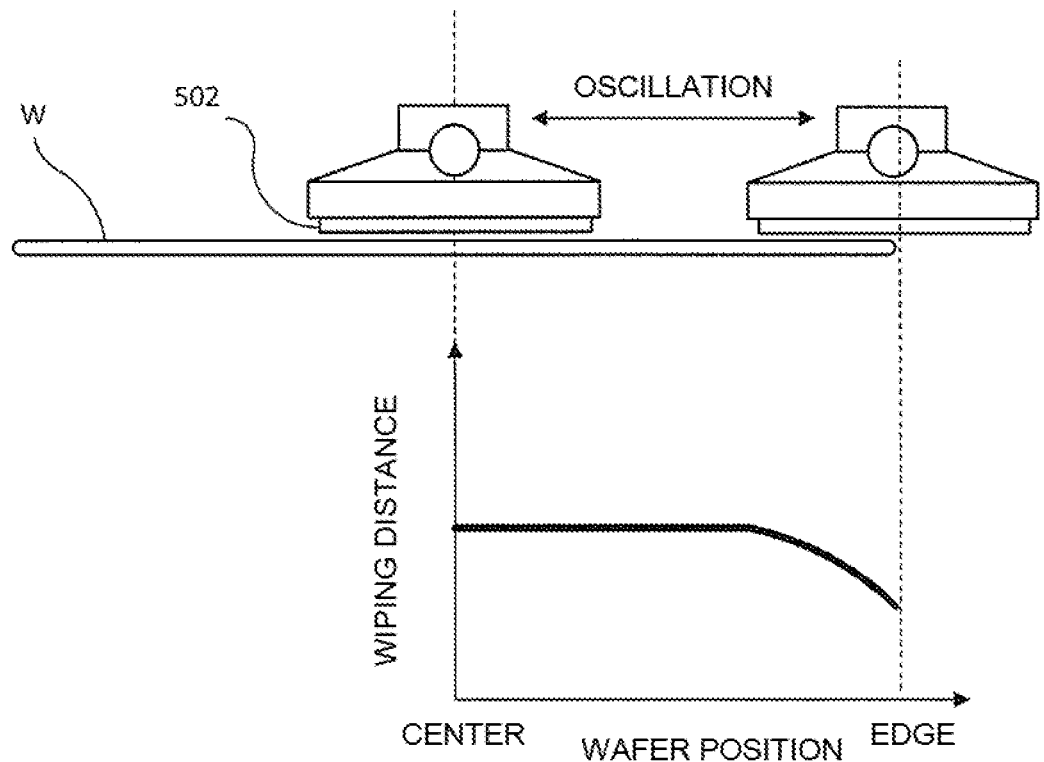
FIG. 1 is a side view of a wafer W being buffed with a buffing pad and also illustrates a graph showing a wiping distance on a wafer position.

When buffing is carried out by oscillating a buffing pad 502 relative to a wafer W (substrate) at a constant rate while the wafer W and the buffing pad 502 are being rotated at respective constant rotational speeds, a wiping distance between the buffing pad 502 and the wafer W is just as shown in FIG. 1.

FIG. 1 is a schematic side view of the buffing pad 502 buffing the wafer W while oscillating on the wafer W. Illustrated under the side view is a graph showing the wiping distance between the buffing pad 502 and the wafer W relative to a position of the wafer W. As illustrated in FIG. 1, when the buffing pad 502 overhangs the wafer W, the wiping distance is decreased toward an edge of the wafer W.

The wiping distance is a product of a contact relative velocity between the buffing pad 502 and the wafer W, and a processing time. Polishing amount therefore can be calculated from Preston's formula by multiplying the wiping distance by pressure that is applied from the buffing pad 502 to the wafer W.

When the buffing pad 502 is completely within a periphery of the wafer W, the pressure of the buffing pad 502 is considered to be substantially even. When the buffing pad 502 overhangs the wafer W, however, pressure concentration occurs in the vicinity of the edge of the wafer W as illustrated in FIG. 2.

Figure 2:
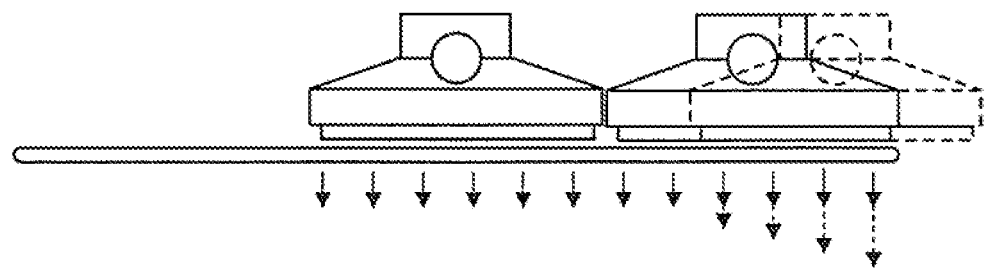
FIG. 2 shows pressure concentration that occurs in a wafer edge when the wafer W is buffed with the buffing pad.

FIG. 2 is a schematic side view of the buffing pad 502 buffing the wafer W while oscillating on the wafer W. Arrows in FIG. 2 denote pressures. The longer arrows represent higher pressures. In FIG. 2, if the buffing pad 502 is located at a position indicated by solid lines, the buffing pad 502 is completely within the periphery of the wafer W, so that the pressure is substantially even as shown by solid arrows. When the buffing pad 502 oscillates to a position indicated by broken lines, however, the buffing pad 502 overhangs the wafer W, which causes the pressure concentration as shown by broken-line arrows in FIG. 2.

To achieve accurate simulation of the polishing amount using Preston's formula, therefore, the pressure concentration needs to be taken into account.

One embodiment of the present invention measures pressure distributions when the buffing pad 502 overhangs the wafer W and calculates a pressure correction value as below.

Figure 3:
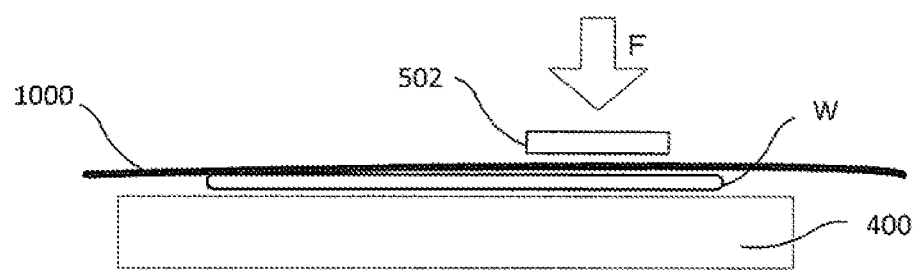
FIG. 3 shows layout during measurement of amount of pressure applied from the buffing pad to the wafer W.

First, the wafer W is set on a buffing table 400. A sheet-type pressure sensor 1000 (tactile sensor) is placed between the wafer W and the buffing pad 502. The buffing pad 502 presses against the wafer W with predetermined force F. The pressure applied to the wafer W is then measured. FIG. 3 is a side view showing layout of the buffing table 400, the buffing pad 502, the sheet-type pressure sensor 1000, and the buffing pad when the pressure applied to the wafer W is measured. The pressure distributions are measured with respect to each overhang amount while the overhang amount is altered by changing the position of the buffing pad 502 relative to the wafer W.

Figure 4:
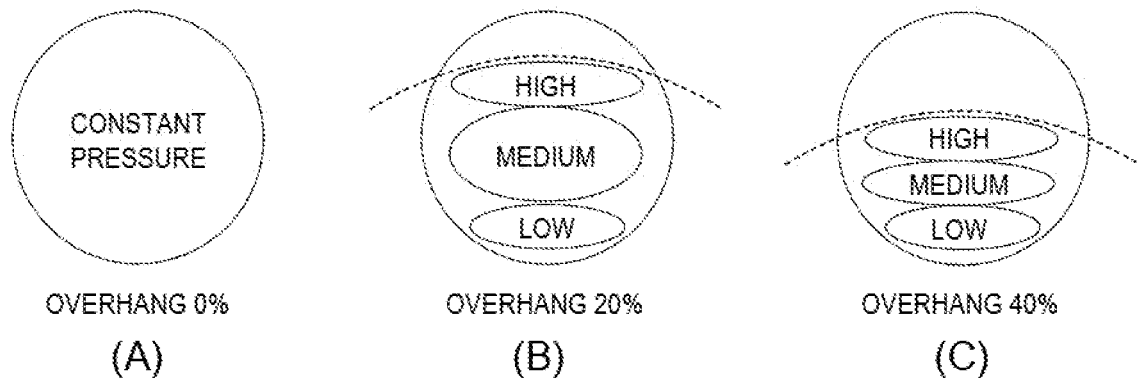
FIG. 4 schematically show results of the pressure measurements illustrated in FIG. 3.

FIG. 4 schematically show the pressure distributions measured by the sheet-type pressure sensor. FIG. 4 schematically respectively show, as an example, the pressure distributions measured when the overhang amounts are zero percent, 20 percent, and 40 percent. The percentage of the overhang amount here means the ratio of overhang amount of the buffing pad 502 against the diameter of the wafer W. For example, a 20 percent overhang amount means that 20 percent of the diameter of the buffing pad 502 is in the outer side of the wafer W. If the buffing pad has a diameter of 100 mm, the diameter of the buffing pad protrudes over the wafer W by 20 mm. In each of FIG. 4, a solid-line circle represents a periphery of the buffing pad. Broken-line arcs each represent a part of the edge of the wafer W.

When the overhang amount is zero percent as illustrated (FIG. 4A), the pressure applied from the buffing pad 402 to the wafer W is substantially even. When the overhang amount is 20 percent (FIG. 4B), the pressure is increased in the vicinity of the edge of the wafer W and decreased toward an inner side of the wafer W. Likewise, when the overhang amount is 40 percent (FIG. 4C), the pressure is increased in the vicinity of the edge of the wafer W and decreased toward the inner side of the wafer W. In FIG. 4, "HIGH", "MEDIUM" AND "LOW" indicate relative pressure magnitudes. The pressure changes in a greater way when the overhang amount is 40 percent as compared to when the overhang amount is 20 percent.

After the measurement of two-dimensional distribution of the pressure applied from the buffing pad 502 to the wafer W, the measured area is divided into plural divisions, and the measured pressure is quantified with respect to each division.

Figure 5:
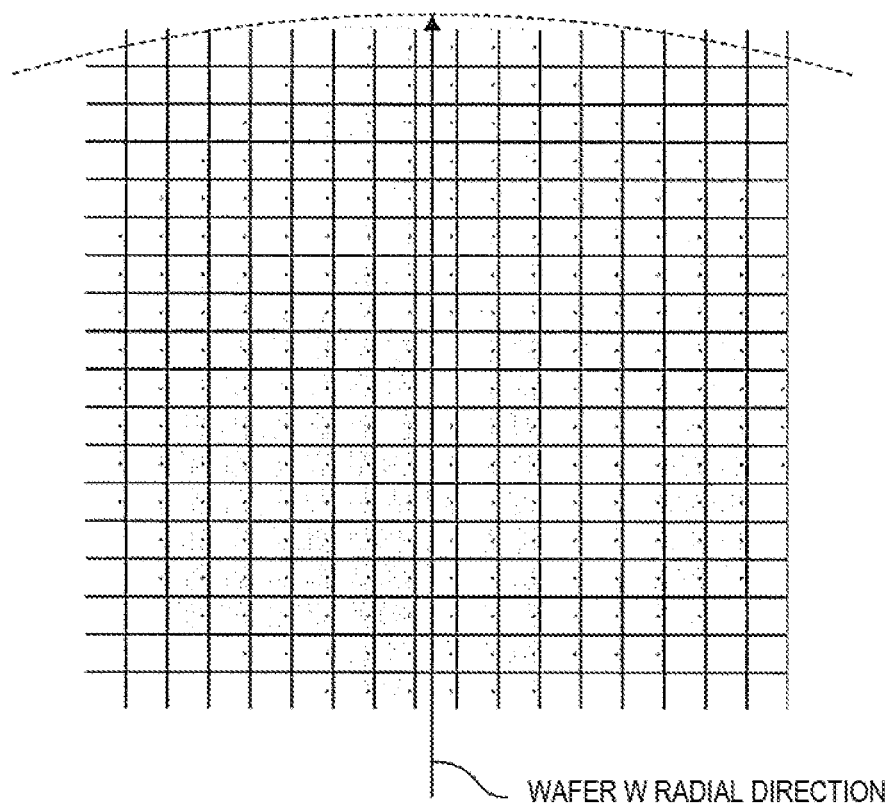
FIG. 5 shows a result of quantification of the amount of pressure applied from the buffing pad to the wafer W.
Figure 6:
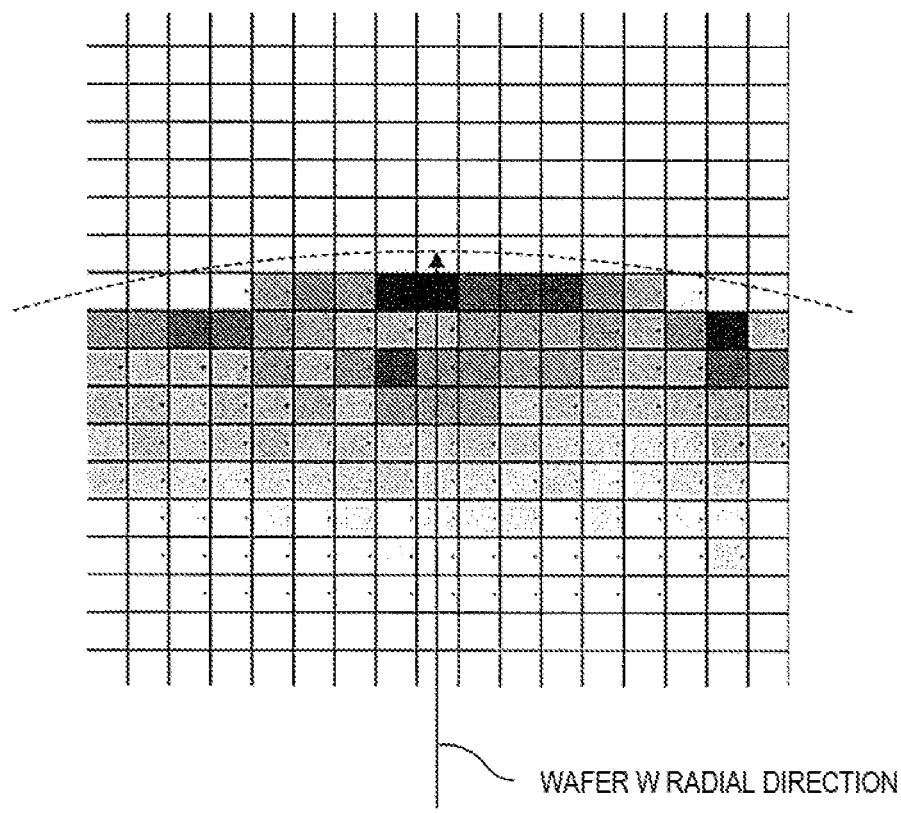
FIG. 6 shows a result of quantification of the amount of pressure applied from the buffing pad to the wafer W.

FIGS. 5 and 6 show, as examples, results of quantification of pressure distributions measured when the overhang amount in FIG. 4 are zero percent and 40 percent, respectively. The magnitude of numerical values is shown in grayscale. In the drawings, darker grays indicate greater numerical values. A broken-line arc in each of the drawings represents a periphery of the wafer W.

As illustrated in FIG. 5, when the overhang amount is zero percent, pressure distributions are substantially even. The divisions lying under the buffing pad 502 have a constant value, for example, 1.0, and are shown in a uniform gray tone as illustrated.

FIG. 6 shows a result of quantification of the pressure distributions measured when the overhang amount is 40 percent. It is evident from the drawing that, due to the pressure concentration that occurs in the circumference of the wafer W, the pressure applied to the circumference of the wafer W is high, and the pressure is decreased toward the inner side of the wafer W.

Secondly, the two-dimensional distribution of pressure, which has been quantified as illustrated in FIGS. 5 and 6, is one-dimensionalized along a radial direction of the wafer W. More specifically, an average of numerical values in a direction of rows (horizontal direction) of FIGS. 5 and 6, or on a so-called wafer circumference, is calculated. The pressure distributions are then one-dimensionalized in the radial direction of the wafer W (arrow directions in FIGS. 5 and 6). In this way, a pressure ratio to the radial direction of the wafer W is calculated.

Figure 7:
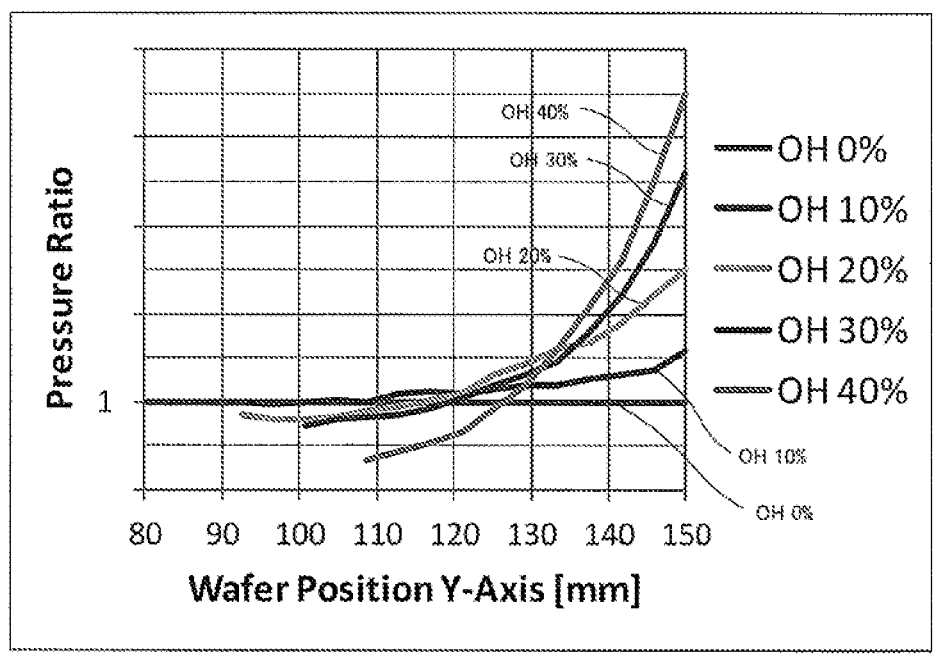
FIG. 7 is a graph showing a pressure ratio on the wafer position with respect to each overhang amount.

FIG. 7 is a graph showing a pressure ratio to the radial direction of the wafer W in the case where the overhang (OH) amount ranges from zero percent to 40 percent, inclusive. A horizontal axis represents a radial position of the wafer W. The wafer W has a diameter of 300 mm. That is, 150 mm on the wafer W-position axis indicates the edge of the wafer W. As illustrated in FIG. 7, the pressure ratio increases toward the edge of the wafer W in proportion to the overhang amount.

The above-described process is repeated, changing the pressure that is applied from the buffing pad 502 to the wafer W within an actual working pressure range. As the result, the pressure ratio to the wafer W position at each working pressure is obtained.

Figure 8:
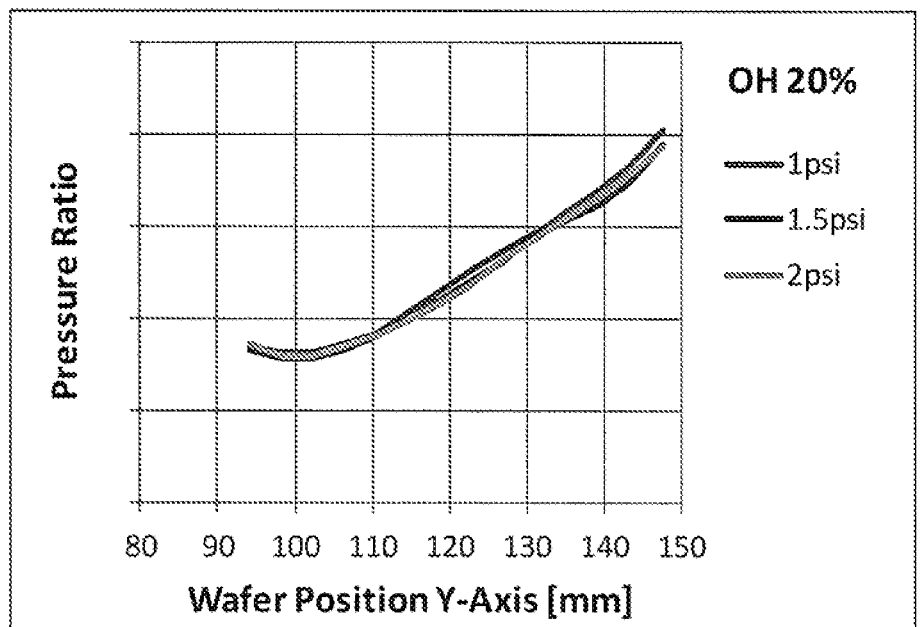
FIG. 8 is a graph showing a pressure ratio on the wafer position with respect to each working pressure.

FIG. 8 is a graph showing the pressure ratio to the wafer W position at three working pressures as an example. The graph shows a case in which the overhang (OH) amount is 20 percent. As is apparent from FIG. 8, even if the working pressure is changed, there is no significant change in the pressure ratio to the wafer W position with respect to each overhang amount. Therefore, the same pressure ratio can be applied, regardless of the working pressure.

In the next, an approximate expression is made from the pressure ratio to the wafer W position with respect to each working pressure. Any expressions, such as a polynomial function, an exponential function, etc., can be used for making the approximate expression.

Figure 9:
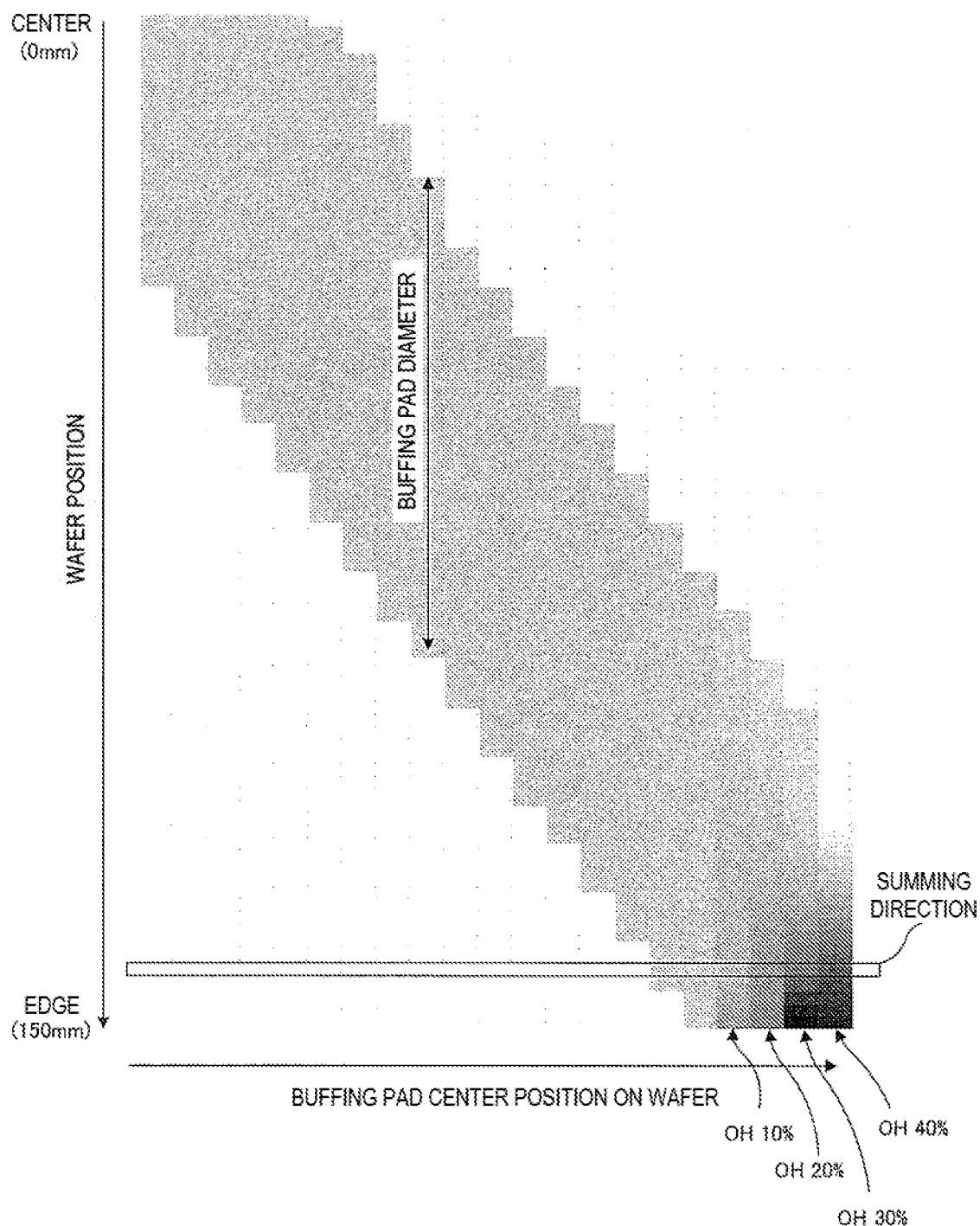
FIG. 9 shows a map of a pressure ratio, in which a horizontal axis represents a center position of the buffing pad on the wafer, and a vertical axis represents the wafer position.

A pressure ratio map relating to the wafer W position and the buffing pad position on the wafer W is then created from the approximate expression. FIG. 9 shows a pressure ratio map relating to the wafer W position and the center position of the buffing pad on the wafer W. A horizontal axis represents the buffing pad position on the wafer W. The buffing pad gets closer to the edge of the wafer W toward the right side of the horizontal axis. A vertical axis represents the position of the wafer W. An upper end of the vertical axis denotes the center of the wafer W, whereas a lower end represents the edge of the wafer W. In FIG. 9, the pressure ratio is shown in grayscale. The darker the gray is, the higher the pressure ratio. The pressure ratio is zero in a region of the wafer W, where the buffing pad 502 does not exist. When the entire surface of the buffing pad 502 lies completely within the periphery of the wafer W (when the overhang amount is zero percent), the pressure ratio is 1.0.

Pressure ratios at the center position of the buffing pad on the wafer W are summed up with respect to each corresponding wafer W position. In other words, the pressure ratios shown in FIG. 9 are summed up along the horizontal axis. The total of the pressure ratios with respect to each wafer W position is divided by the buffing pad diameter (except for the position where the pressure ratio is zero). A result of the division is a pressure correction value at each wafer W position.

Figure 10:
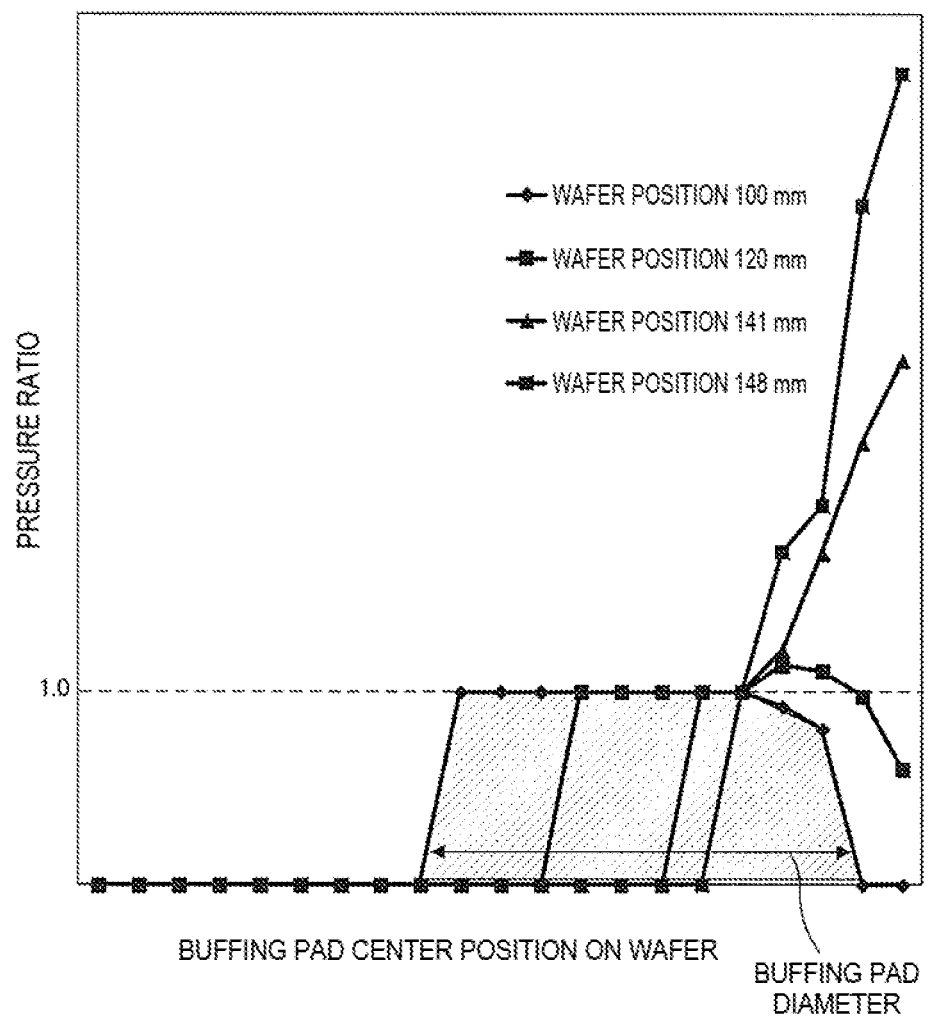
FIG. 10 is a graph showing a pressure ratio on the center position of the buffing pad on the wafer with respect to each wafer position.

FIG. 10 is a graph showing as an example the pressure ratio to the center position of the buffing pad on the wafer W when wafer positions are 100 mm, 120 mm, 141 mm, and 148 mm. The pressure correction value at each wafer position can be calculated by calculating area on the graph, which is shown in FIG. 10 with respect to each wafer position, and dividing the area by the buffing pad diameter (except for the position where the pressure ratio is zero). As an example, FIG. 10 includes a shaded area that is the area in the case where the wafer position is 100 mm, and shows the buffing pad diameter by an arrow.

Figure 11:
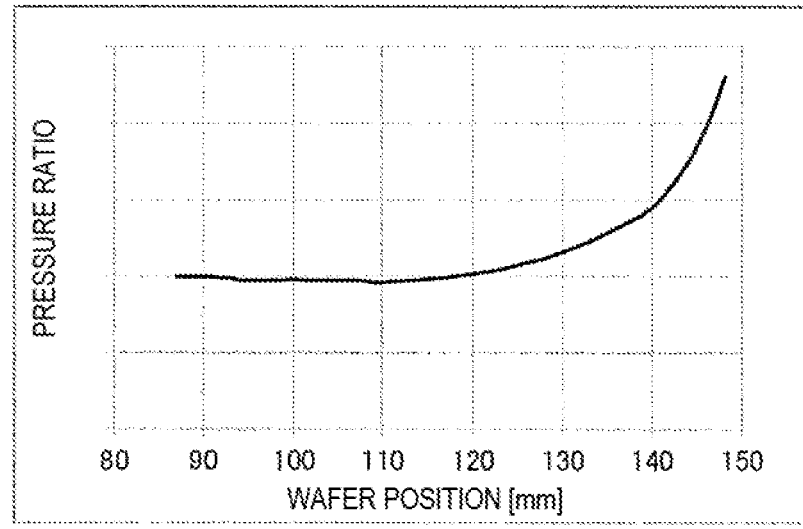
FIG. 11 is a graph showing a pressure ratio to the wafer position.

FIG. 11 is a graph showing a pressure correction value at each wafer position, which is calculated as explained in the description of FIG. 10. As illustrated in FIG. 11, the pressure correction value becomes larger toward the edge of the wafer.

Figure 12:
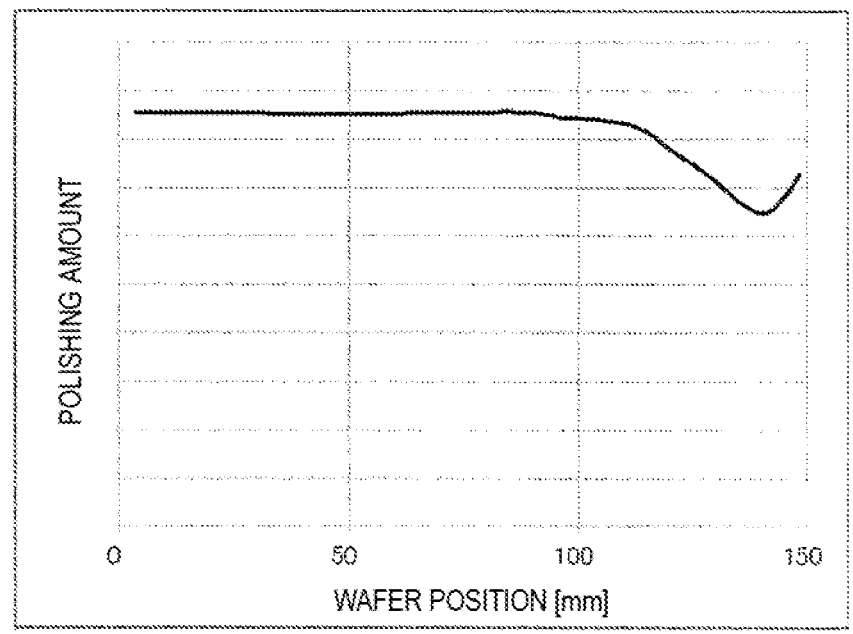
FIG. 12 is a graph showing an example of a polishing profile in which pressure correction applied during overhang is made.

Once the pressure correction value at each wafer W position is determined as described, the pressure correction value can be applied to the pressure p in Preston's formula h∝pvt. The wiping distance shown in FIG. 1 is a product of oscillation velocity and polishing time. Polishing amount can be calculated by multiplying the wiping distance by the pressure p. The substantially constant pressure p obtained when the buffing pad 502 does not overhang the wafer W is multiplied by the pressure correction value at each wafer position, to thereby obtain the polishing amount taking into account the overhang of the buffing pad 502. To be more precise, the wiping distance shown in FIG. 1 is multiplied by the substantially constant pressure p and the pressure correction value shown in FIG. 11, which makes it possible to simulate the wafer polishing amount, namely, a wafer polishing profile. FIG. 12 is a graph showing an example of the polishing profile that is obtained using constant oscillation velocity and constant pressure, taking into account the pressure correction applied during overhang.

According to the present invention, since it is possible to simulate the wafer polishing amount taking into account the overhang of the buffing pad, a variety of design parameters of the buffing apparatus can be estimated and optimized by performing the simulation. For example, the simulation can be performed for optimization of the buffing pad diameter, optimization of rotational speed and rotational speed ratio of the wafer and the buffing pad, optimization of the area where the buffing pad oscillates on the wafer, optimization of the buffing pad oscillation velocity distribution, etc. Technology relating to pressure measurement, which is disclosed here, is not limited to the above-described embodiments and can be also applied to a case in which a pad of a smaller size than a substrate is pressed against the substrate.

The following description explains the polishing amount simulation using the pressure correction value applied during the buffing pad overhang, and also describes creation of buffing conditions.

First, the polishing amount simulation using the pressure correction value applied during the buffing pad overhang will be explained. As already discussed, the polishing amount can be basically calculated in accordance with Preston's formula h∝pvt. In Preston's formula, h is the polishing rate or polishing amount of a substrate (object to be polished); p is load or pressure applied to the substrate); v is contact relative velocity or contact relative velocity of an area, the polishing amount of which is calculated between a polishing member and the substrate; and t is polishing time. vt represents a wiping distance between the substrate (wafer) and the polishing pad (buffing pad). The polishing amount is basically proportional to the wiping distance and the pressure. However, the actual polishing amount varies with conditions. For this reason, empirical values obtained by actually performing the buffing on various conditions are used as parameter coefficients to improve accuracy in the polishing amount simulation. The polishing amount is calculated from a formula, wiping distance×pressure×pressure correction value×parameter coefficient.

In the present embodiment, the buffing pad is rotated and simultaneously pressed against the wafer in rotation to polish the wafer. In this process, the buffing pad is oscillated on the wafer to polish the entire surface of the wafer. The wiping distance can be calculated by a simulator based on software that is separately commercially available. The graph of FIG. 1 shows the wiping distance in the case where the buffing pad rotating at constant speed is oscillated on the wafer rotating at constant speed.

Figure 13:
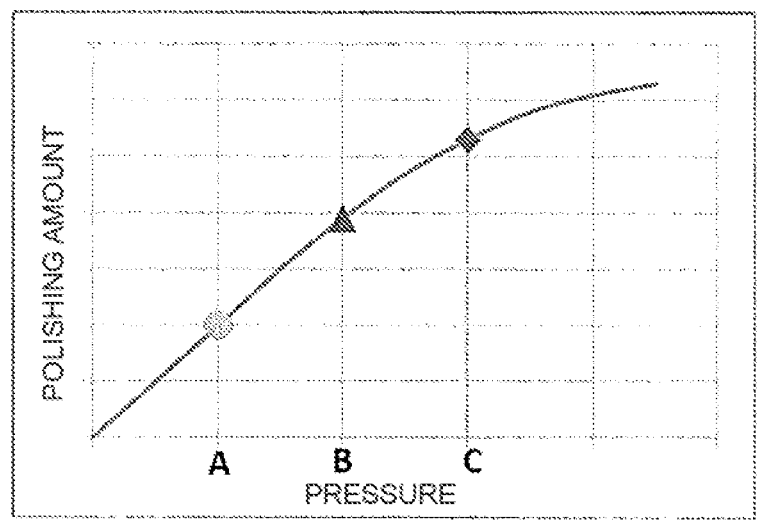
FIG. 13 is a graph showing polishing amount in a case where buffing is actually carried out on the same conditions except that different pressures A, B and C are applied.
Figure 14:
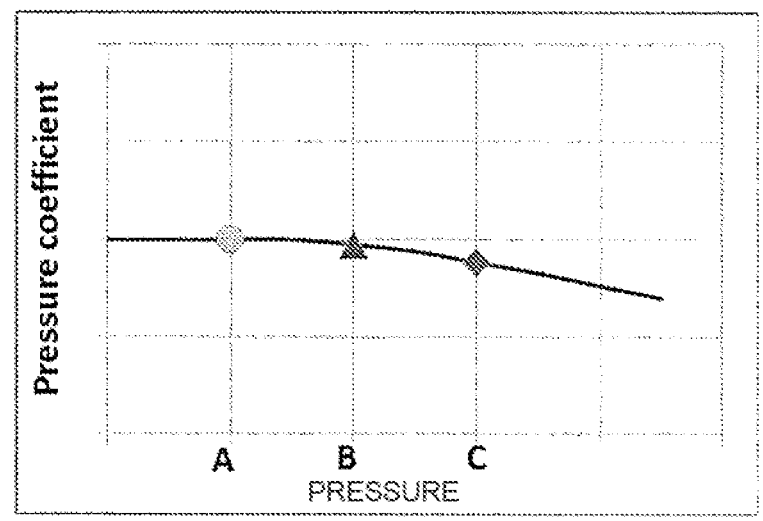
FIG. 14 is a graph showing pressure coefficients obtained under the pressures A, B and C illustrated in FIG. 13.

The parameter coefficient is calculated from buffing conditions, features of a dresser, slurry, and a buffing pad that are used for the buffing, and the like. For example, the parameter coefficient can be determined by a polishing amount/pressure ratio as a pressure coefficient that can be one of the parameter coefficients. FIG. 13 is a graph showing the polishing amount in a case where the buffing is actually carried out on the same conditions except that different pressures A, B and C are applied. The polishing amount shown in FIG. 13 is divided by the pressure to calculate the pressure coefficient. FIG. 14 shows pressure coefficients at the pressures A, B and C. In the same manner, various parameter coefficients can be determined from a slurry flow rate and dilution rate, the features of the dresser and the buffing pad, which are used for the buffing, etc. Actual parameter coefficients can be acquired as below. The coefficient is assumed as "1" under predetermined baseline conditions (for example, the pressure is 1 psi; the slurry flow rate is 0.3 L/min; and the buffing pad is provided with horizontal and vertical grooves in a contact face with the wafer). Change amounts of the polishing amount under conditions other than the predetermined baseline conditions can be used as various parameter coefficients. The parameter coefficients are previously obtained from a test and stored in a database.

If the pressure correction value applied during the buffing pad overhang is used, the polishing amount can be calculated from the formula, wiping distance×pressure×pressure correction value×parameter coefficient. FIG. 12 shows an example of the polishing amount (also referred to as polishing profile) that is calculated by the foregoing method.

The following description explains a method for determining buffing conditions for acquiring a desired polishing profile by using the polishing amount simulation. Consideration is given to a case in which the oscillation velocity of the buffing pad is determined as a buffing condition for acquiring the desired polishing profile on the condition that the rotational speed of the buffing pad, the rotational speed of the wafer, and the pressure applied from the buffing pad to the wafer are given values that are set by user.

Figure 15:
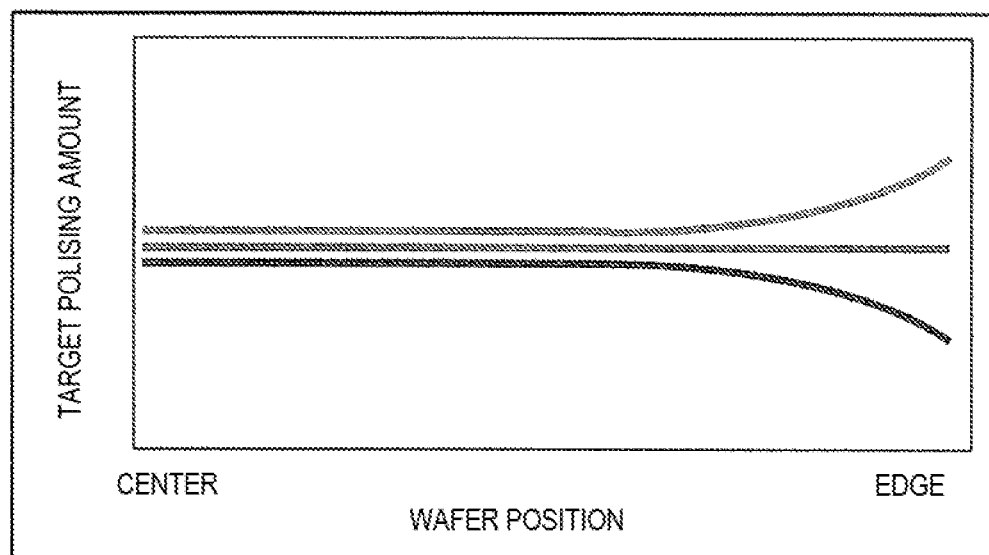
FIG. 15 shows examples of target polishing profiles of the wafer.

FIG. 15 shows examples of target polishing profiles of the wafer. FIG. 15 illustrates a polishing profile in which the entire surface of the wafer is planarized, a polishing profile in which the polishing amount is decreased toward the wafer edge, and a polishing profile in which the polishing amount is increased toward the wafer edge. The buffing pad oscillation velocity that is determined in the following description is for achieving the polishing profile in which the entire surface of the wafer is planarized as a target wafer profile.

First, the polishing profile obtained at constant oscillation velocity is calculated by the foregoing method on the buffing conditions (the rotational speed of the buffing pad, the rotational speed of the wafer, the pressure applied from the buffing pad to the wafer, etc.) that are set by user. If the polishing profile is calculated in this way, a planarized polishing profile cannot be acquired in the vicinity of the wafer edge as seen in FIG. 12 due to the pressure concentration that occurs during the overhang and the wiping distance distribution. To solve this, time duration in which the buffing pad stays on the wafer is adjusted to obtain such oscillation velocity distributions that the entire surface of the wafer is planarized.

Figure 16:
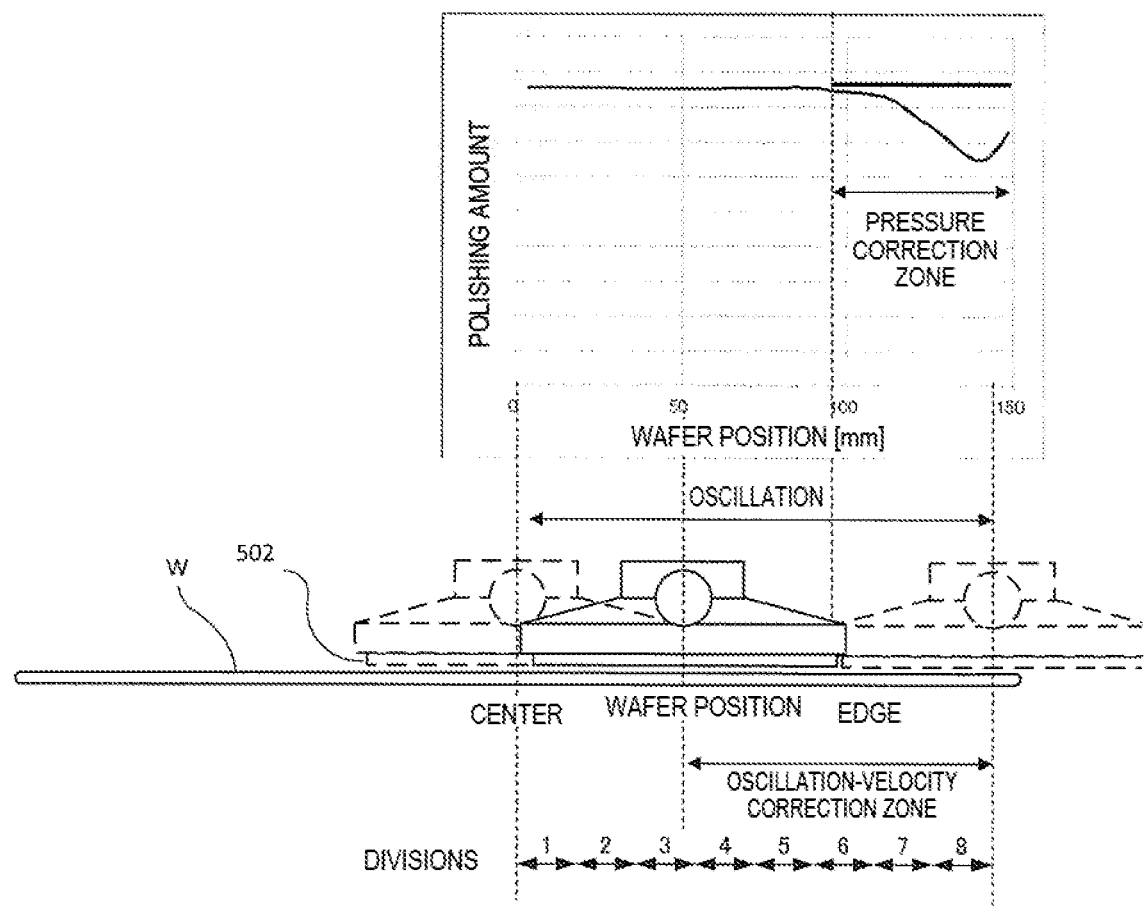
FIG. 16 shows a state in which an oscillation zone where the buffing pad oscillates from the center of the wafer toward the edge of the wafer is evenly divided into eight, and also shows a pressure correction zone and an oscillation velocity correction zone.

To obtain the oscillation velocity distributions of the buffing pad, the wafer position is divided in a direction from the center of the wafer toward the edge of the wafer. In the present embodiment, the oscillation velocity is determined with respect to each division so that the entire surface of the wafer is planarized. FIG. 16 shows as an example a state in which an oscillation zone where the buffing pad oscillates from the center of the wafer toward the edge of the wafer is evenly divided into eight. As other embodiments, the number of divisions may be more or less than eight. The oscillation zone does not have to be evenly divided and, for example, may be divided so that the divisions are smaller in the vicinity of the wafer edge.

Since the buffing pad has constant area, a zone in which the oscillation velocity is corrected differs from the pressure correction zone in which the pressure is corrected taking into account the overhang. In concrete terms, as illustrated in FIG. 16, the oscillation velocity correction zone begins from where the buffing pad oscillates from the center toward the edge and enters the pressure correction zone.

Figure 17:
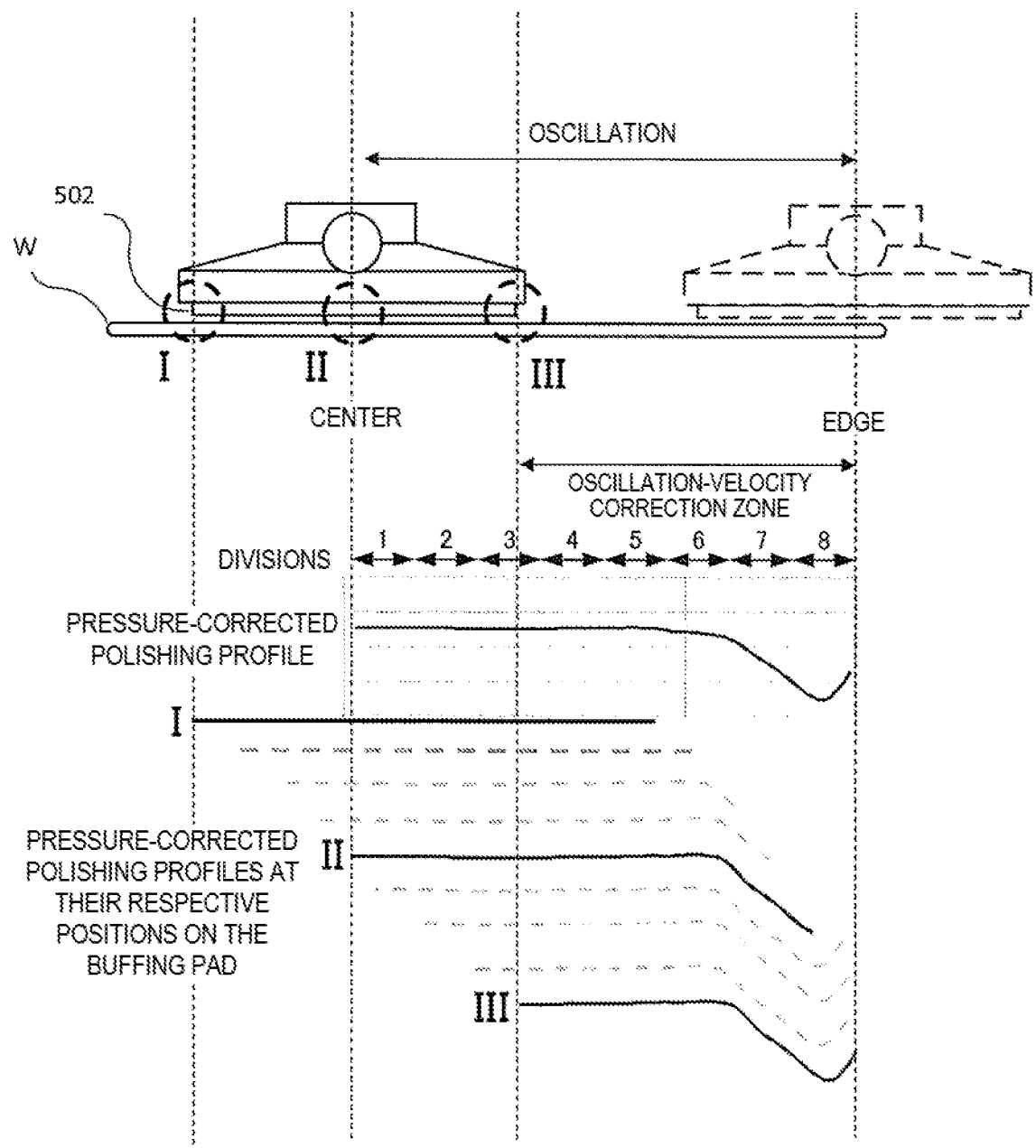
FIG. 17 is a schematic view showing a method for calculating the oscillation-velocity correction value according to one embodiment.

A method for calculating a correction value of the oscillation velocity correction zone will be explained below with reference to FIGS. 17 and 18. FIG. 17 shows, in a lower half of the drawing, pressure-corrected polishing profiles at positions I, II and III of the buffing pad oscillating from the center of the wafer toward the edge of the wafer. Curved lines between I and II and those between II and III in FIG. 17 correspond to the pressure-corrected polishing profiles at positions between I and II and those II and III of the buffing pad. As discussed below, the correction value of the oscillation zone can be calculated by synthesizing these polishing profiles.

Figure 18:
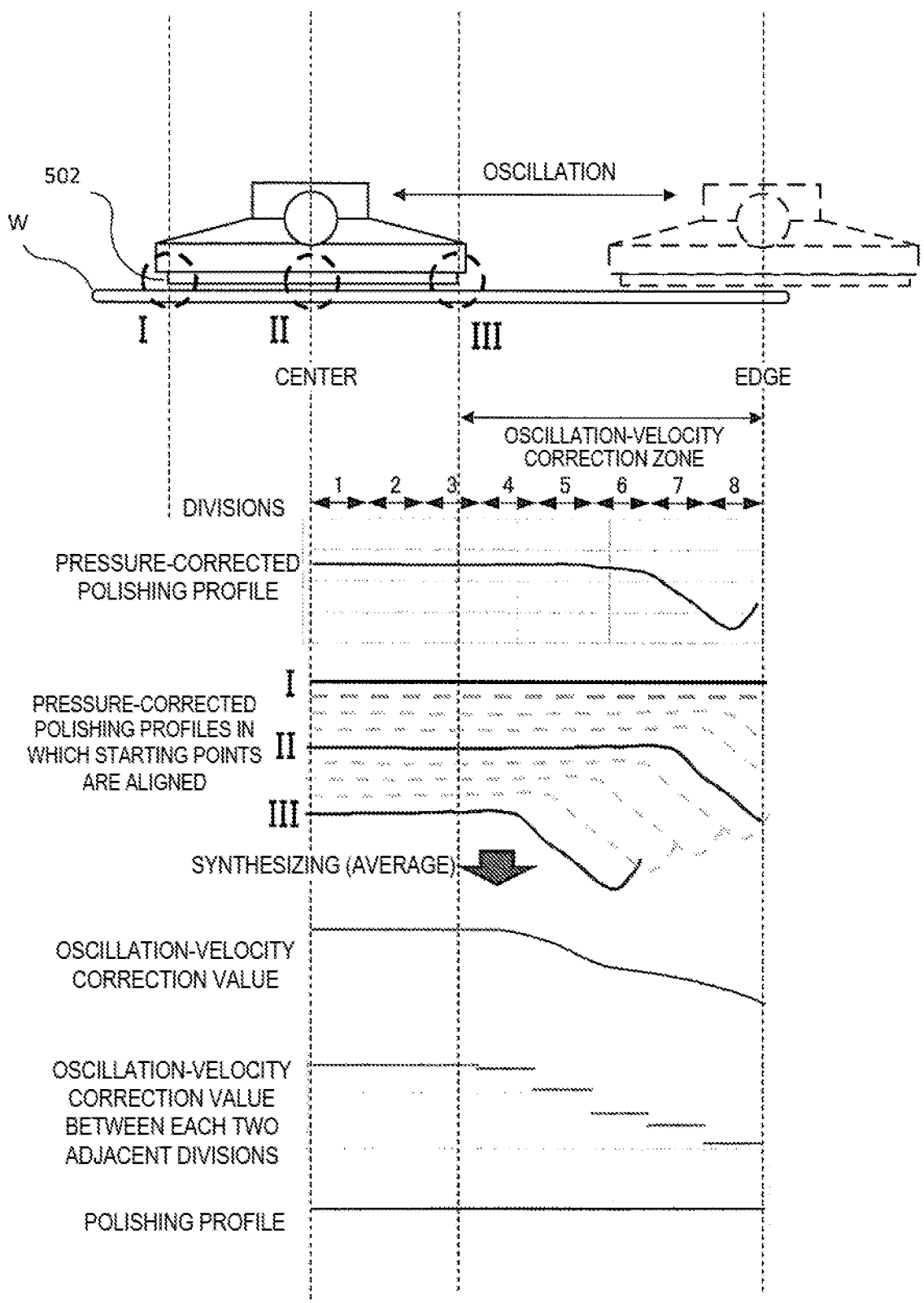
FIG. 18 is a schematic view showing a method for calculating the oscillation-velocity correction value according to one embodiment.

To calculate the oscillation-velocity correction value, oscillation starting points of the pressure-corrected polishing profiles at the respective positions of the buffing pad are aligned with one another as shown in FIG. 18. An average of the pressure-corrected polishing profiles at the respective positions of the buffing pad with the oscillation starting points aligned is the correction value of the oscillation velocity. If the buffing pad oscillates on the wafer so that the velocity distributions are achieved in accordance with the oscillation-velocity correction value, a planarized polishing profile can be obtained. The oscillation velocity of the buffing pad may be successively controlled so that the oscillation velocity corresponds with the oscillation-velocity correction value. In the present embodiment, an oscillation range is divided into eight as described above, and the oscillation velocity is controlled to be constant within each division. To that purpose, velocity in each division is calculated from the obtained oscillation-velocity correction value. In the embodiment illustrated in FIG. 18, the oscillation velocity in each division is an average value of the oscillation-velocity correction values within the corresponding division.

It is thus possible to calculate the oscillation velocity of the buffing pad for achieving the target polishing profile (in the foregoing example, polishing profile for planarizing entire surface) from the user-set buffing conditions. FIG. 18 shows that the planarized polishing profile can be obtained if the polishing amount is simulated based on the user-set buffing conditions and the user-created buffing pad oscillation velocity.

Figure 19:
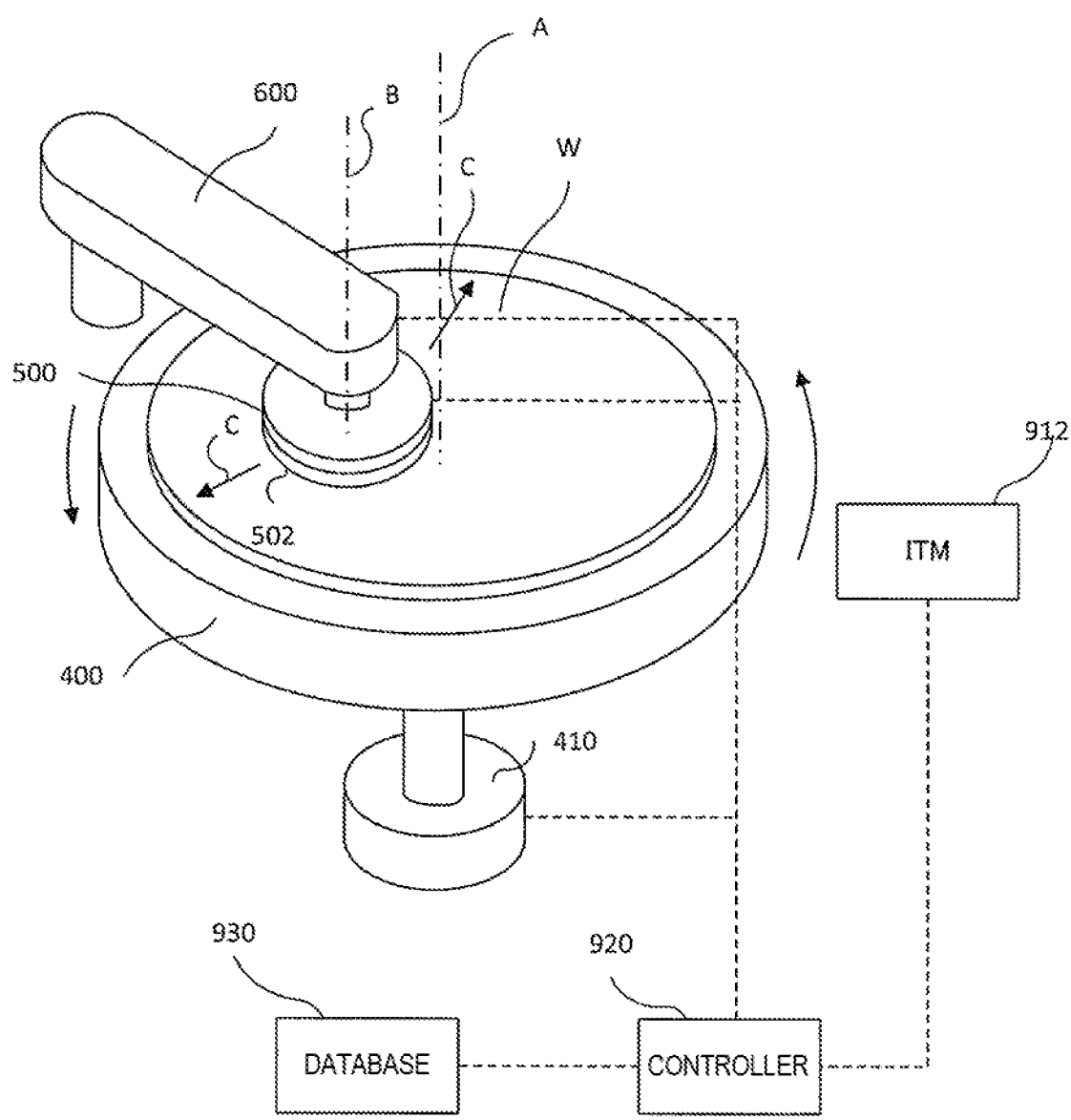
FIG. 19 is a schematic view showing a buffing apparatus according to one embodiment.

A buffing apparatus with the above-described simulation function will be described below. FIG. 19 shows a schematic configuration of a buffing apparatus 300A according to one embodiment. As illustrated in FIG. 19, the buffing apparatus 300A comprises the table 400 on which the wafer W is set, a head 500 fitted with the buffing pad 502 for processing a to-be-processed surface of the wafer W, and an arm 600 adapted to the head 500. The buffing apparatus 300A may further comprise a process liquid supply system for supplying a process liquid and a conditioning section for conditioning (dressing) the buffing pad 502. For clear illustration, the process liquid supply system and the conditioning section are omitted in FIG. 19. The buffing pad 502 illustrated in FIG. 19 has a smaller diameter than the wafer W. As an example, if the wafer W has a diameter of 300 mm, the diameter of the buffing pad 502 is preferably 100 mm or smaller, and more preferably, falls in a range between 60 mm and 100 mm. The process liquid may be at least one of DIW (deionized water), a cleansing liquid, and a polishing liquid such as slurry. The buffing pad 502 is made of, for example, a foamed polyurethane-type hard pad, a suede-type soft pad or sponge. When controlling or reworking is carried out to reduce dispersion within the wafer surface, a smaller contact area between the buffing pad 502 and the wafer W makes it possible to deal with a wider variety of dispersions. In this view, it is desirable that the buffing pad diameter is small. To be more precise, the buffing pad diameter is 70 mm or smaller and preferably 50 mm or smaller. The kind of the buffing pad 502 may be selected as necessary in consideration of the material of the substrate and the condition of contamination to be removed. For example, when the contamination is varied under the surface of the substrate, the hard pad that makes it easy to apply a physical force to the contamination, that is, a pad with high hardness or rigidity, may be used as a pad. When the substrate is a material having a small mechanical strength, such as a low-k film, the soft pad may be used to reduce damage to the to-be-processed surface. When the process liquid is a polishing liquid such as slurry, a substrate removal rate, contamination removal efficiency, and whether or not damage occurs are not determined solely by the hardness or rigidity of the pad. The pad thereby may be selected as appropriate. The above-listed pads may have surfaces provided with grooves, such as concentric grooves, X-Y grooves, convoluted grooves, and radiate grooves. It is also possible to provide the pad with at least one hole formed through the pad to supply the process liquid through the hole. The pad may be made of sponge-type material, such as PVA sponge, into which the process liquid can penetrate. It is then possible to achieve uniform distributions of a process liquid flow within the pad surface and quick discharge of the contamination removed by the processing.

The table 400 has a mechanism for vacuum-chucking the wafer W and thus holds the wafer W. The table 400 can be rotated around a rotation axis A by means of a drive mechanism 410. The table 400 may also be configured to bring the wafer W into angle rotation or scroll motion by means of the drive mechanism 410. The buffing pad 502 is fitted to a surface of the head 500, which faces the wafer W. The head 500 is rotatable around a rotation axis B by means of a drive mechanism, not shown. The head 500 is capable of pressing the pad 502 against the to-be-processed surface of the wafer W by means of a drive mechanism, not shown. The arm 600 is capable of oscillating the head 500 as shown by arrows C within the radius or diameter of the wafer W. The arm 600 is further capable of oscillating the head 500 to such a position that the buffing pad 502 faces the conditioning section, not shown.

As illustrated in FIG. 19, the buffing apparatus 300A includes a Wet-ITM (In-line Thickness Monitor) 912. The Wet-ITM 912 includes a detection head that is located above the wafer W without making contact with the wafer W and moves over the entire surface of the wafer. The Wet-ITM 912 thus can detect (measure) film thickness distributions (or distributions of information about film thickness) of the wafer W. The Wet-ITM is useful as an ITM for taking measurement during the processing. However, the ITM may be designed to take measurement after the buffing.

A controller 920 is capable of controlling various operations of the buffing apparatus. The controller 920 controls the pressure applied from the buffing pad 502 to the wafer, rotational number of the buffing head 500, rotational number of the buffing table 400, oscillation velocity of the buffing head 500, etc. The controller 920 receives the film thickness of the to-be-processed surface of the wafer, which has been detected by the ITM 912, or a signal corresponding to the film thickness. The controller 920 includes a user interface and receives buffing conditions entered and/or selected by user. The controller 920 has a function of calculating the pressure correction of the buffing pad, a function of simulating the polishing amount, and a function of calculating optimum oscillation velocity distributions of the buffing pad to achieve the desired polishing profile. The controller 920 may comprise a dedicated or all-purpose computer. For example, the controller 920 can be configured by installing computer programs including commands for implementing the above-mentioned various control functions, calculations, and simulations in an all-purpose computer. The computer programs can be stored in an all-purpose storage medium, such as a hard disc, a CD, and a DVD. A common user interface, such as a monitor, a mouse, a keyboard, and a tablet, may be used as the user interface of the controller 920.

The buffing apparatus 300A further includes a database (storage section) 930 that previously stores the polishing amount corresponding to a plurality of buffing conditions (the pressure of the buffing pad 502 against the wafer W, the rotational number of the head 500, and a time duration in which the buffing pad 502 is in contact with the wafer W). The database 930 also stores preset target film thickness distributions of the to-be-processed face of the wafer W. The database 930 further stores after-mentioned data of various kinds, which are required for the polishing amount simulation.

Figure 20:
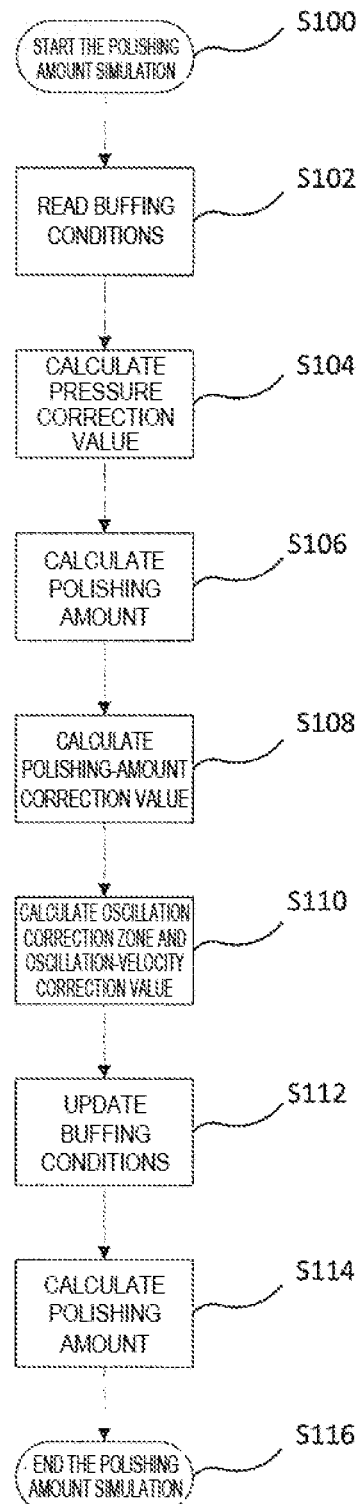
FIG. 20 is a flowchart showing the steps of buffing simulation according to one embodiment.

FIG. 20 is a flowchart for explaining the steps of the polishing amount simulation and the optimization of the oscillation velocity in the buffing apparatus 300A. The polishing amount simulation and the optimization of the oscillation velocity are carried out by the controller 920.

As illustrated in FIG. 20, the buffing simulation is first started (Step S100). In this step, software required for the simulation is activated in the controller 920.

Polishing conditions for the simulation is then entered (Step S102). The buffing conditions include, for example, the size of the wafer as a substrate, the size of the buffing pad 502, the pressure at which the buffing pad 502 is pressed against the wafer, the oscillation range of the buffing head 500, the rotational number of the buffing table 400, the rotational number of the buffing head 500, and the oscillation velocity of the buffing head 500. These conditions can be entered through the user interface provided to the controller 920.

In the next step, the pressure correction value is calculated from the entered buffing conditions (Step S104). The pressure correction value is a value that is required when the buffing pad 502 overhangs the wafer. The pressure correction value can be calculated by the above-described method and is as shown in FIG. 11, for example. The pressure correction value is previously determined according to the sizes of the buffing pad and the wafer used for the buffing through a test by the steps described above, and is stored in the database 930. It is then possible to use the pressure correction value that is required to meet the buffing conditions entered in Step S102.

The polishing amount is then calculated from the buffing conditions entered in Step S102 and the pressure correction value calculated in Step S104 (Step S106). The polishing amount can be calculated from a formula, wiping distance× pressure×parameter coefficient, using Preston's formula. As mentioned above, the parameter coefficient is previously determined by a test or the like and stored in the database 930, which makes it possible to use the parameter coefficient that is required to meet the buffing conditions entered in Step S102. The polishing amount results in, for example, the polishing profile shown in FIG. 12.

The next step calculates difference between the target polishing profile and the polishing profile calculated in Step S106 (Step S108). The difference is a polishing-amount correction value. The target polishing profile may be entered in either Step S102 or Step S108. For example, the polishing profile shown in FIG. 15 may be selected as the target polishing profile.

The next step calculates an oscillation correction zone and an oscillation-velocity correction value, which are required to achieve the target polishing profile (Step S110). The oscillation-velocity correction value can be calculated by the method explained with reference to FIGS. 15 to 18.

In the next step, the buffing conditions entered in Step S102 are updated based on the oscillation-velocity correction value calculated in Step S110 (Step S112). To be specific, the oscillation velocity is replaced with the oscillation velocity calculated in Step S110.

The polishing amount is calculated again on the buffing conditions updated in Step S112 (Step S114). Since the oscillation velocity has been optimized, the target polishing profile is calculated.

The buffing simulation is then ended (Step S116).

Figure 21:
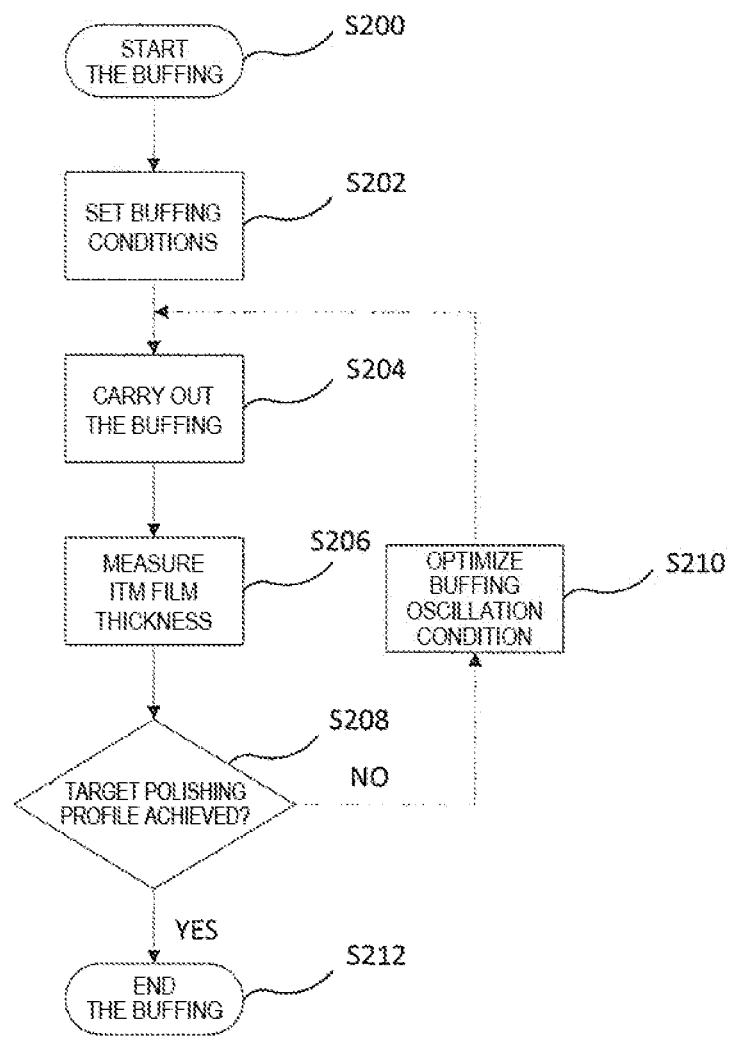
FIG. 21 is a flowchart showing the steps of buffing using the buffing simulation according to one embodiment.

The buffing method using the above-discussed buffing simulation will be now explained. FIG. 21 is a flowchart showing the buffing method using the buffing simulation according to one embodiment. The buffing can be carried out using, for example, the buffing apparatus 300A illustrated in FIG. 19.

Once the buffing is started (Step S200), the buffing conditions are first set (Step S202). The buffing conditions used here are the buffing conditions created using the polishing amount simulation explained with reference to FIG. 20.

The buffing is started on the buffing conditions set in Step S202 (Step S204).

When the buffing carried out on the set buffing conditions is finished, the film thickness of the wafer that has been buffed is measured by the film thickness monitor (ITM 912) (Step S206).

The next step determines whether the polishing profile obtained from the film thickness distributions measured by the film thickness monitor conforms to the target polishing profile (Step S208). The determination can be made by, for example, comparing the obtained polishing profile with the target polishing profile in the buffing simulation to check if the obtained polishing profile satisfies given conditions.

If Step S208 determines that the target polishing profile is not achieved, buffing oscillation conditions are optimized (S210), and the buffing is carried out again. The buffing oscillation conditions can be implemented by the buffing simulation. More specifically, in Step S108 associated with the buffing simulation, the polishing-amount correction value is calculated from the difference between the target polishing profile and the polishing profile measured in Step S206, and the oscillation correction zone and the oscillation-velocity correction value are calculated again. The buffing is carried out again on the buffing conditions thus obtained.

If Step S208 determines that the target polishing profile is achieved, the buffing is ended (Step S208).

According to another embodiment, closed-loop control in which the determination by Step S208 and the optimization by Step S210 take place does not necessarily have to be implemented.

According to the present invention, it is possible to simulate the wafer polishing amount taking into account the buffing pad overhang as discussed above. Therefore, the estimation and optimization of various design parameters of the buffing apparatus can be made by carrying out the foregoing simulation.

REFERENCE SIGNS LIST 400 buffing table
410 drive mechanism
500 buffing head
502 buffing pad
600 buffing arm
912 ITM (film thickness monitor)
920 controller
930 database
1000 sheet-type pressure sensor
W wafer

The invention claimed is:

1. A method for simulating polishing amount in a case where a polishing pad of a smaller size than a substrate is used to buff the substrate, the method including:
    measuring distributions of pressure that is applied from the polishing pad to the substrate according to each overhang amount of the polishing pad relative to the substrate by using a pressure sensor;
    quantifying the measured distributions of the pressure applied to the substrate with respect to the each overhang amount of the polishing pad relative to the substrate;
    one-dimensionalizing the quantified pressure distributions with respect to the each overhang amount along a radial direction of the substrate;
    summing the one-dimensionalized pressure distributions of the each overhang amount in the radial direction of the substrate;
    determining a pressure correction value by dividing the sum of the one-dimensionalized pressure distributions of the polishing pad in the each radial position of the substrate by a distance of the polishing pad on the substrate; and
    correcting the pressure that is used in the polishing amount simulation in accordance with the overhang amounts and the measured pressure distributions.

2. The simulation method of claim 1, further comprising: simulating polishing amount in a case where a part of the polishing pad oscillates over the substrate during buffing.

3. The simulation method of claim 2, wherein:
    the polishing amount is calculated using the determined pressure correction value.

4. The simulation method of claim 2, further comprising: calculating a buffing condition that is required to achieve a given target polishing amount.

5. The simulation method of claim 4, wherein:
the buffing condition to be calculated is oscillation velocity of the polishing pad.

\* \* \* \* \*